United States Patent [19]
Ko et al.

[11] Patent Number: 5,180,468
[45] Date of Patent: Jan. 19, 1993

[54] METHOD FOR GROWING A HIGH-MELTING-POINT METAL FILM

[75] Inventors: Kwang-Ok Ko, Seoul; Jong-Ho Park, Kyounggi, both of Rep. of Korea

[73] Assignee: Samsung Electronics Co., Ltd., Kyungki, Rep. of Korea

[21] Appl. No.: 575,627

[22] Filed: Aug. 31, 1990

[30] Foreign Application Priority Data

Jul. 5, 1990 [KR] Rep. of Korea ............... 1990-10173

[51] Int. Cl.$^5$ .................. C23C 14/00; C23C 16/00
[52] U.S. Cl. .................... 156/644; 427/38; 427/255.1; 427/255.2
[58] Field of Search ............. 427/255.1, 255.2, 38; 156/644

[56] References Cited

U.S. PATENT DOCUMENTS

| | | | |
|---|---|---|---|
| 4,180,596 | 12/1979 | Crowder | 427/255.1 |
| 4,565,157 | 1/1986 | Brors | 427/255.2 |
| 4,595,608 | 6/1986 | King | 427/255.2 |
| 4,741,928 | 5/1988 | Wilson | 427/255.1 |
| 4,746,549 | 5/1988 | Ito | 427/255.1 |
| 4,749,597 | 6/1988 | Mendonea | 427/255.1 |
| 4,766,006 | 8/1988 | Gaizi | 427/38 |
| 4,800,105 | 1/1989 | Nakayama | 427/255.1 |
| 4,804,560 | 2/1989 | Shioya | 427/255.1 |
| 4,847,111 | 7/1989 | Chon | 427/38 |
| 4,849,260 | 7/1989 | Kusumoto | 427/255.1 |
| 4,892,843 | 1/1990 | Schmitz | 427/255.2 |
| 4,902,533 | 2/1990 | White | 427/255.1 |
| 4,981,723 | 1/1991 | Hirase | 427/255.1 |

FOREIGN PATENT DOCUMENTS

| | | | |
|---|---|---|---|
| 254651 | 1/1988 | European Pat. Off. | 427/255.2 |
| 1110767 | 5/1986 | Japan | 427/255.1 |
| 1021074 | 1/1989 | Japan | 427/255.1 |

*Primary Examiner*—Shrive Beck
*Assistant Examiner*—V. Duong Dang
*Attorney, Agent, or Firm*—Robert E. Bushnell

[57] ABSTRACT

There is disclosed a process for growing a high-melting-point metal film comprising the steps of forming a first ion-implanted layer in a given region of a silicon substrate, in which region a second ion-implanted layer is formed; contacting a high-melting-point metal fluoride gas with the surface of the second ion-implanted layer to adhere the high-melting-point metal thereto; growing the high-melting-point metal film of a given thickness by reacting the mixture of the high-melting-point metal fluoride and silane gas; and subjecting the silicon substrate to a heat treatment, characterized in that the above third and fourth steps are alternatively repeated.

13 Claims, 3 Drawing Sheets

METHOD FOR GROWING A HIGH-MELTING-POINT METAL FILM

BACKGROUND OF THE INVENTION

The present invention concerns a process for producing semiconductor devices, particularly a process for growing a tungsten film of a high-melting-point during a metallization process.

In metallization for semiconductor devices, a chemical vapor deposition (CVD) technique is attractive for making a uniform layer of good step coverage. Unlike the vacuum deposition, which suffers from a shadow effect and imperfect step coverage, the CVD techniqe can yield good step coverage even with great irregularity of the surface condition of the semiconductor devices, and also yields lower electrical resistivity.

One of the efforts of depositing metal for semiconductor devices by the CVD technique has been in deposition of a metal of high refractory characteristics such as tungsten, W. chemical symbol W. Tungsten also has a low resistivity (5.3 $\mu\Omega$-cm), and may be grown from tungsten fluoride ($WF_6$) by both pyrolytic and reduction reaction.

Referring to FIG. 1 for illustrating the result of a conventional process for selectively growing tungsten W, in a given region of a silicon layer 1 is formed a junction layer 2 by ion implantation, over which the junction layer 2 is covered by an insulating layer 3 which is selectively etched to form a pattern, through which tungsten 4 is grown by the CVD technique. In this case, in order to improve the adherence between the tungsten and the junction layer 2 in the initial growing step, plasma etching is performed on the surface of the layer by using $NF_3$, $SF_6$ gases, etc., thus roughening the surface, or silane ($SiH_4$) reduction is performed after hydrogen ($H_2$) reduction is performed so as to grow the tungsten thereon. However, the plasma etching results in a considerable corrosion in a contacting region 5 between the layer 2 and the tungsten, so that a large amount of the silicon in the contacting layer 2 is eroded causing the thickness of the contacting layer 2 to thin, thus increasing current leakage. Alternatively, if the tungsten is grown by $SiH_4$ reduction, bad adherence occurs, which causes removal of the tungsten.

SUMMARY OF THE INVENTION

It is therefore an object of the present invention to provide a process for growing tungsten, with a use of a CVD technique, which improves the adherence between the tungsten and the junction layer without damaging the junction layer.

It is another object of the present invention to prevent current leakage in metallization of semiconductor devices.

According to an aspect of the present invention, the inventive process is characterized in that, after ion implantation of a region to be contacted with the tungsten, the pyrolysis of the mixture of $WF_6$ and $SiH_4$ gases and annealing are alternatively repeated to grow a tungsten film of a given thickness.

The present invention will now be described with reference to the drawings attached only by way of example.

BRIEF DESCRIPTION OF THE ATTACHED DRAWINGS

For a better understanding of the invention and to show how the same may be carried into effect, reference will now be made. by way of example, to the accompanying diagrammatic drawings, in which.

DETAILED DESCRIPTION OF A CERTAIN PREFERRED EMBODIMENT

Figure 1:
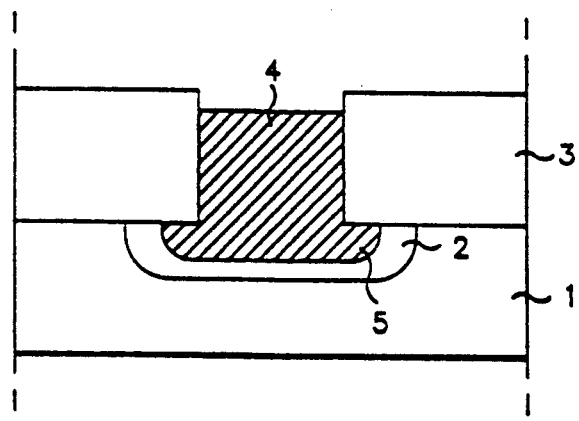
FIG. 1 is a schematic cross-section of a semiconductor device according to the conventional process.
Figure 2:
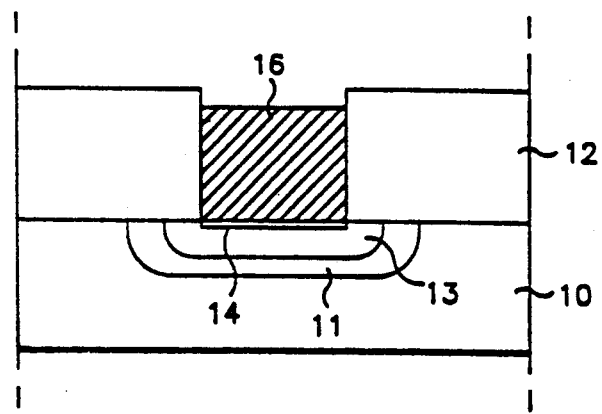
FIG. 2 is a view similar to FIG. 1 according to the inventive process.

Referring to FIG. 2, in silicon substrate 10 are formed first and second ion-implanted layers 11 and 13. Between the second ion-implanted layer 13 and tungsten film 16 grown according to the pattern of insulating layer 12, there is interposed thin contacting layer 14, which has an irregular surface damaged by ion implantation to adhere the tungsten film 16 to the silicon substrate 10. The degree of the surface damage by ion implantation is negligible compared with the case by conventional plasma etching, while improving the adherence of the surface of the junction layer. The contacting layer 14 is formed by annealing after the reaction between $SiH_4$ and $WF_6$.

Figure 3A:
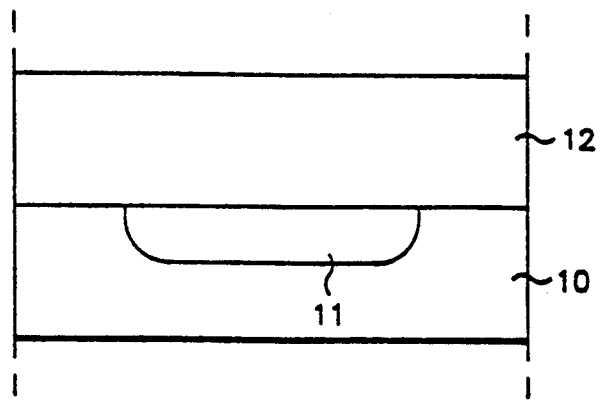
FIGS. 3A-3E illustrate the steps of the inventive process.

Referring to FIGS. 3A-3E, the inventive process for growing the tungsten film will now be described. In FIG. 3A, P type or N type impurity is ion-implanted into the silicon substrate 10 with the amount of $5 \times 10^{20}$ ions/cm$^2$, over which an insulating layer 12 of BPSG (Boro-Phosphorus Silicate Glass) is covered. In this case, the ion-implanted P or N type impurity is activated so as to form the first ion-implanted region 11 (or, first collecting region).

Figure 3B:
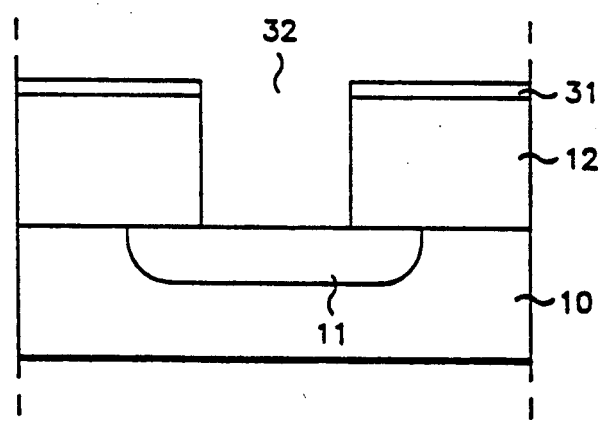

Referring to FIG. 3B, over the insulating layer is formed a photoresist pattern 31 to selectively etch the insulating layer 12, so that contacting aperture 32 is formed to expose the surface of the the first ion-implanted layer 11.

Figure 3C:
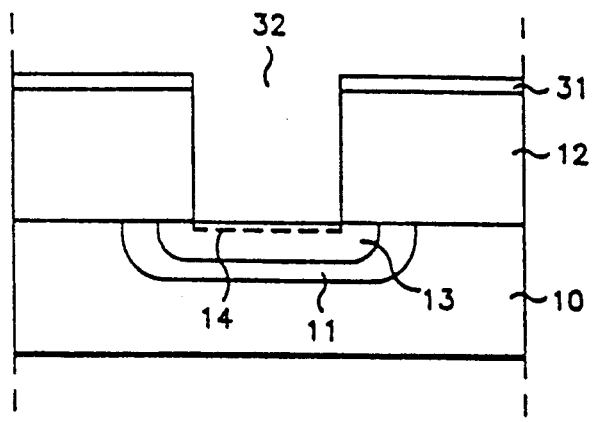

Referring to FIG. 3C, in the bottom surface of the contacting aperture 32 exists imperfection layer 14 having the thickness of about 200-500 Å which is formed by double-performed ion implantation. The ion-implanted substance may be Si, As, B, P, etc. The imperfection layer 14 has a rough surface to increase the adherence between the substrate and the tungsten during the tungsten forming process.

Figure 3D:
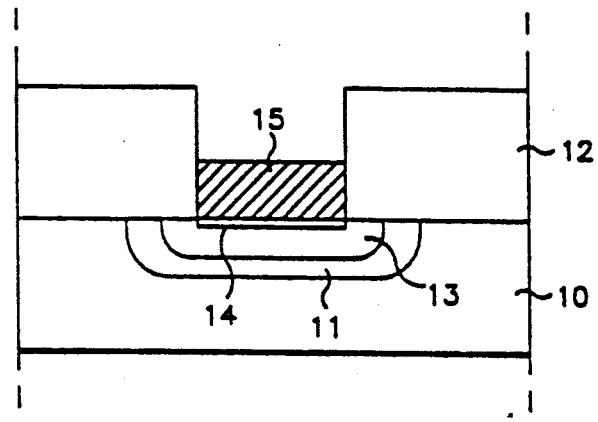

Referring to FIG. 3D, after removing the photoresist pattern 31, tungsten fluoride ($WF_6$) is reacted with the silicon substrate 10 so as to cause silicon reduction to grow tungsten on the surface of the imperfection layer 14 with a small consumption of silicon. The above silicon reduction formula can expressed as follows:

$$WF_6 + 3Si \rightarrow 2W + 6SiF_4 \qquad (1)$$

Herein, the adherence of the tungsten and the silicon substrate 10 is increased due to the high surface energy of the imperfection layer 14. Thereafter, with the mixture of tungsten fluoride $WF_6$ and silane $SiH_4$ gases having the ratio of about 3 to 2, the CVD process is performed at the temperature of 280°-300° C. for 45-90 seconds so as to grow initial tungsten film 15 having the thickness of about 1,500–3,000Å. In this case, the reaction formula is as follows:

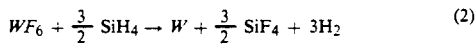
$$WF_6 + \frac{3}{2} SiH_4 \rightarrow W + \frac{3}{2} SiF_4 + 3H_2 \qquad (2)$$

If the ratio of silane ($SiH_4$) gas to tungsten fluoride ($WF_6$) is 2 to 1 or 3 to 1, there will be formed tungsten silicide $WSi_2$. Hence, it is to be noticed that the ratio of silane $SiH_4$ to tungsten fluoride should be relatively small so as to only grow tungsten W.

Figure 3E:
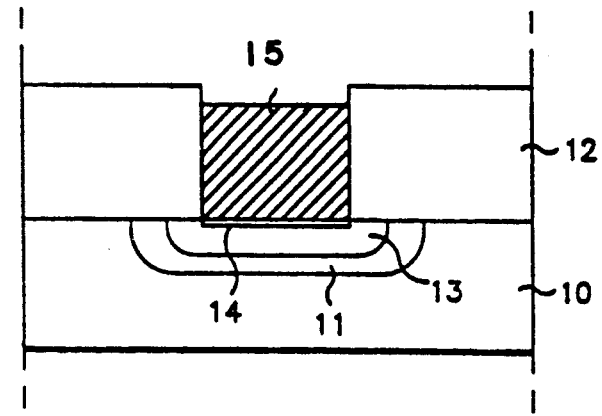

Subsequently, the silicon substrate 10 is annealed at the temperature of about 450° C. for about 2 minutes, which is again subjected to tungsten growing by using the mixture of $WF_6$ and $SiH_4$. In this way, the tungsten growing and annealing are alternatively repeated until the tungsten film 16 of a given thickness is obtained as shown in FIG. 3E.

Herein, it will be appreciated by a person skilled in this technical field that the thickness of the tungsten film obtained by a single growing step by the mixture of $WF_6$ and $SiH_4$ gases is determined according to the desired growing adequacy of the tungsten layer.

As described above, according to the present invention, in the surface of the silicon substrate is formed a thin imperfection layer by performing ion implantation twice, which imperfection layer is caused to have an increased adherence to tungsten through silicon reduction. Thereafter, $SiH_4$ reduction and annealing are alternatively repeated to grow tungsten, so that a uniform tungsten film of good adherence is obtained.

Further, the present invention ensures good step coverage and prevents current leakage due to uniform high-melting-point metal growth.

While the invention has been particularly shown and described with reference to a preferred embodiment, it will be understood by those skilled in the art that modifications in detail may be made without departing from the spirit and scope of the invention.

What is claimed is:

1. A method for growing a high-melting-point metal film, comprising the steps of:
   forming a first ion-implanted layer in a given region of a silicon substrate, and forming in said first ion-implanted layer a second ion-implanted layer;
   contacting a surface of said second ion-implanted layer with a gas of fluoride and a high melting point metal to adhere a film of said high-melting-point metal to the surface;
   growing said high-melting-point metal film to a given thickness by reacting the gas of said high-melting-point metal fluoride with silane gas; and
   subjecting said silicon substrate to a heat treatment;
   repeating, alternatively, said high-melting-point metal film growing step and said step of subjecting said silicon substrate to a heat treatment.

2. A method as claimed in claim 1, wherein said first and second ion-implanted layers in said step for forming said first ion-implanted layer and in said step for forming said second ion-implanted layer are of silicon, arsenic, boron, or phosphorus.

3. A method as claimed in claim 1, wherein an imperfect layer of about 200–500Å is formed on a surface of said second ion-implanted layer during said step for forming said second ion-implanted layer in said first ion-implanted layer.

4. A method as claimed in claim 1, wherein a mixing ratio of said high-melting-point metal fluoride gas and silane gas is about 3 to 2, said growing step further comprising the step of:
   reacting said gas of said high-melting-point metal fluoride with silane gas for 45 to 90 seconds at a temperature between 280° C. and 300° C. to grow said high-melting-point metal film having a thickness of about 1,500–3,000Å.

5. A method as claimed in claim 1, wherein said step for subjecting said silicon substrate to a heat treatment is continued for about 2 minutes at a temperature of about 450° C.

6. The method for growing a high-melting-point metal film as claimed in claim 1, wherein said step of subjecting said silicon substrate to a heat treatment comprises a step of annealing said silicon substrate.

7. A method for growing a high-melting-point metal film comprising the steps of:
   forming a first ion-implanted layer in a given region of a silicon substrate, over which an insulating layer is deposited;
   selectively etching said insulating layer to form a contacting aperture through which a portion of said first ion-implanted layer is exposed;
   forming on a surface of said first ion-implanted layer a second ion-implanted layer having surface imperfection by ion-implantation of a given impurity through said contacting aperture;
   contacting tungsten fluoride gas with said second ion-implanted layer through said contacting aperture to grow a film of tungsten and reduce the silicon on the surface of said section ion-implanted layer;
   pyrolyzing the tungsten fluoride gas and a silane gas, having the ration of three to two, respectively, through said contacting aperture for 45–90 seconds at a temperature between 280° and 300° C., so as to grow a tungsten film having the thickness of 1,500–3,000Å; and
   subjecting said silicon substrate to a heat treatment for two minutes at the temperature of about 450° C.;
   whereby said step of pyrolyzing the tungsten fluoride and silane gases and said step of subjecting said silicon substrate to a heat treatment are alternatively repeated.

8. A method as claimed in claim 7, wherein said ion-implanted impurity is of silicon, arsenic, boron, or phosphorus.

9. A method as claimed in claim 7, wherein an imperfect layer of about 200–500Å is formed on a surface of said second ion-implanted layer in said step of forming said second ion-implanted layer on said surface of said first ion-implanted layer.

10. A process for forming a metal film, comprising the steps of:
   forming a first ion-implanted layer within a region of a silicon semiconductor;
   forming a second ion-implanted layer within said first ion-implanted layer;
   exposing a surface of said second ion-implanted layer to a gaseous phase of a fluoride and refractory metal composition to cause a reduction of silicon of said surface and form a film of said refractory metal on the surface;
   growing said refractory metal film to successively increasing thicknesses by reacting a mixture of said fluoride and refractory metal composition with silane gas in the presence of said refractory metal film;

annealing said silicon substrate; and repeating said step of growing said refractory metal film to successively increasing thicknesses and said step of annealing said silicon substrate until said refractory metal film is grown to a selected thickness.

11. A process for forming a metal film, comprising the steps of:

forming a first ion-implanted layer within a region of a silicon semiconductor;

forming an insulating layer over said first ion-implanted layer;

etching an opening through said insulating layer to expose said first ion-implanted layer before forming a second ion-implanted layer;

forming said second ion-implanted layer within said first ion-implanted layer;

exposing a surface of said second ion-implanted layer to a gaseous phase of a fluoride and refractory metal composition to cause a reduction on silicon of said surface and form a film of said refractory metal on the surface;

growing said refractory metal film to successively increasing thicknesses by reacting a mixture of said fluoride and refractory metal composition with silane gas in the presence of said refractory metal film;

annealing said silicon substrate; and repeating said step of growing said refractory metal film to successively increasing thicknesses and said step of annealing said silicon substrate until said refractory metal film is grown to a selected thickness.

12. A process for forming a metal film, comprising the steps of:

forming a first ion-implanted layer within a region of a silicon semiconductor;

forming a second ion-implanted layer within said first ion-implanted layer;

exposing a surface of said second ion-implanted layer to a gaseous phase of a fluoride and refractory metal composition to cause a reduction of silicon of said surface and form a film of said refractory metal on the surface;

growing said refractory metal film to successively increasing thicknesses by reacting a mixture of said fluoride and refractory metal composition with silane gas, with a ratio of about three to two between said composition and said silane gas, in the presence of said refractory metal film;

annealing said silicon substrate; and repeating said step of growing said refractory metal film to successively increasing thicknesses and said step of annealing said silicon substrate until said refractory metal film is grown to a selected thickness.

13. A process for forming a metal film, comprising the steps of:

forming a first ion-implanted layer within a region of a silicon semiconductor;

forming an insulating layer over said first ion-implanted layer;

etching an opening through said insulating layer to expose said first ion-implanted layer before forming a second ion-implanted layer;

forming said second ion-implanted layer within said first ion-implanted layer;

exposing a surface of said second ion-implanted layer to a gaseous phase of a fluoride and refractory metal composition to cause a reduction of silicon of said surface and form a film of said refractory metal on the surface;

growing said refractory metal film to successively increasing thickness by reacting a mixture of said fluoride and refractory metal composition with silane gas, with a ratio of about three to two between said composition and said silane gas, in the presence of said refractory metal film;

annealing said silicon substrate; and repeating said step of growing said refractory metal film to successively increasing thicknesses and said step of annealing said silicon substrate until said refractory metal film is grown to a selected thickness.

* * * * *